(12) United States Patent
Anderson et al.

(10) Patent No.: US 12,105,129 B2
(45) Date of Patent: Oct. 1, 2024

(54) WIDEBAND TUNABLE RYDBERG MICROWAVE DETECTOR

(71) Applicant: ColdQuanta, Inc., Boulder, CO (US)

(72) Inventors: Dana Zachary Anderson, Boulder, CO (US); Haoquan Fan, Erie, CO (US); Ying-Ju Wang, Boulder, CO (US); Eric Magnuson Bottomley, Broomfield, CO (US); Steven Michael Hughes, Louisville, CO (US)

(73) Assignee: ColdQuanta, Inc., Boulder, CO (US)

( * ) Notice: Subject to any disclaimer, the term of this patent is extended or adjusted under 35 U.S.C. 154(b) by 52 days.

(21) Appl. No.: 17/690,577

(22) Filed: Mar. 9, 2022

(65) Prior Publication Data
US 2022/0291268 A1 Sep. 15, 2022

Related U.S. Application Data

(60) Provisional application No. 63/160,783, filed on Mar. 13, 2021.

(51) Int. Cl.
*G01R 29/08* (2006.01)
(52) U.S. Cl.
CPC ..... *G01R 29/0878* (2013.01); *G01R 29/0892* (2013.01)
(58) Field of Classification Search
CPC .......... G01R 29/0878; G01R 29/0892
See application file for complete search history.

(56) References Cited

U.S. PATENT DOCUMENTS

| 10,979,147 | B2 | 4/2021 | Gordon |
| 11,002,777 | B2 * | 5/2021 | Salim ............... G01R 29/0885 |
| 11,165,505 | B2 | 11/2021 | Gordon |
| 2011/0234219 | A1 | 9/2011 | Boehi |

(Continued)

FOREIGN PATENT DOCUMENTS

| JP | 2013044901 | 3/2013 |
| WO | 2021077041 | 4/2021 |
| WO | 2021178037 | 9/2021 |

OTHER PUBLICATIONS

Fan et al., Atom Based RF Electric Field Sensing, Journal of Physics B: Atomic, Molecular and Optical Physics, Topical Review, published Sep. 9, 2015, pp. 1-16.

(Continued)

*Primary Examiner* — Jermele M Hollington
*Assistant Examiner* — Suresh K Rajaputra
(74) *Attorney, Agent, or Firm* — Van Pelt, Yi & James LLP; Clifton Leon Anderson

(57) ABSTRACT

An electromagnetic field detector including a vapor cell, an excitation system, and a frequency tuner is described. The vapor cell has a plurality of quantum particles therein. The excitation system excites the quantum particles to a first Rydberg state. The first Rydberg state has a transition to a second Rydberg state at a first frequency. The frequency tuner generates a tunable field in a portion of the vapor cell. The tunable field shifts the first Rydberg state and/or the second Rydberg state such that the transition to the second Rydberg state is at a second frequency different from the first frequency. The detection frequency range for the electromagnetic field detector is continuous and includes the first frequency and the second frequency.

20 Claims, 4 Drawing Sheets

(56) References Cited

U.S. PATENT DOCUMENTS

| | | | |
|---|---|---|---|
| 2016/0363617 | A1 | 12/2016 | Anderson |
| 2018/0189653 | A1 | 7/2018 | Burchard |
| 2019/0187198 | A1* | 6/2019 | Anderson .......... G01R 29/0878 |
| 2020/0233025 | A1 | 7/2020 | Salim |
| 2020/0292606 | A1 | 9/2020 | Holloway |
| 2020/0295838 | A1* | 9/2020 | Gordon ................ H04B 10/548 |
| 2021/0048465 | A1 | 2/2021 | Anderson |
| 2021/0056455 | A1 | 2/2021 | Shehab |
| 2021/0159987 | A1 | 5/2021 | Zhang |
| 2021/0255228 | A1 | 8/2021 | Salim |
| 2021/0270882 | A1 | 9/2021 | Imhof |
| 2022/0003829 | A1 | 1/2022 | Anderson |
| 2022/0196716 | A1* | 6/2022 | Anderson .............. G01R 29/10 |
| 2022/0291268 | A1 | 9/2022 | Anderson |
| 2023/0137266 | A1* | 5/2023 | McBride ................ G01V 8/005 250/389 |

OTHER PUBLICATIONS

Jau et al., Vapor-Cell-Based Atomic Electrometry for Detection Frequencies below 1 kHz, Physical Review Applied 13, 2020, pp. 054034-1-054034-11.

Jing et al., Atomic Superheterodyne Receiver Based on Microwave-Dressed Rydberg Spectroscopy, Nature Physics, vol. 16, Sep. 2020, pp. 911-915.

Ma et al., Measurement of DC and AC Electric Fields Inside an Atomic Vapor Cell with Wall-Integrated Electrodes, Jun. 3, 2021, pp. 1-9.

Anderson et al., Rydberg atoms for radio-frequency communications and sensing: atomic receivers for pulsed RF field and phase detection, Rydberg Technologies Inc., Ann Arbor, MI 48103 USA; Oct. 18, 2019, 10 pages.

Berweger et al., Rydberg state engineering: A comparison of tuning schemes for continuous frequency sensing, Sep. 28, 2022; 11 pages.

Berweger et al., Rydberg-State Engineering: Investigations of Tuning Schemes for Continuous Frequency Sensing, Physical Review Applied 19, 044049, 13 pages, Apr. 18, 2023.

Bohaichuk et al., The Origins of Rydberg Atom Electrometer Transient Response and its Impact on Radio Frequency Pulse Sensing, Quantum Valley Ideas Laboratories, Sep. 13, 2022, 20 pages.

Cai et al., Sensitivity improvement of Rydberg atom-based microwave sensing via electromagnetically induced transparency, Nov. 15, 2021, 8 pages.

Carr et al., Three-photon electromagnetically induced transparency using Rydberg states, Optics Letters / vol. 37, No. 18, Sep. 15, 2012, 3 pages.

Carter et al., Electric field sensing near the surface microstructure of an atom chip using cold Rydberg atoms, Department of Physics and Astronomy and Institute for Quantum Computing, University of Waterloo, Dec. 21, 2013, 7 pages.

Daschner et al., Triple stack glass-to-glass anodic bonding for optogalvanic spectroscopy cells with electrical feedthroughs, Physikalisches Institut, Mar. 5, 2014, 4 pages.

David Henry Meyer, Magnetic & Electric Field Sensing and Applications Based on Coherent Effects in Neutral Atoms, 2018, 265 pages.

Fan et al., Sub-wavelength microwave electric field imaging using Rydberg atoms inside atomic vapor cells, Homer L. Dodge Department of Physics and Astronomy, The University of Oklahoma, Mar. 14, 2014, 5 pages.

Grabowski et al., High Resolution Rydberg Spectroscopy of ultracold Rubidium Atoms, Aug. 25, 2016, 9 pages.

Holloway et al., Broadband Rydberg Atom Based Self-Calibrating RF E-Field Probe, National Institute of Standards and Technology (NIST), Electromagnetics Division, 3 pages.

Holloway et al., Broadband Rydberg Atom-Based Electric-Field Probe: From Self-Calibrated Measurements to Sub-Wavelength Imaging, National Institute of Standards and Technology (NIST), U.S. Department of Commerce, Boulder Laboratories, May 27, 2014, 12 pages.

Holloway et al., Electric field metrology for SI traceability: Systematic measurement uncertainties in electromagnetically induced transparency in atomic vapor, Journal of Applied Physics 121, 233106; doi: 10.1063/1.4984201, 2017, 10 pages.

Holloway et al., Electromagnetically induced transparency based Rydberg-atom sensor for quantum voltage measurements, Oct. 26, 2021, 13 pages.

Hu et al., Continuously tunable radio frequency electrometry with Rydberg atoms, Appl. Phys. Lett. 121, 014002; https://doi.org/10.1063/5.0086357, Jul. 7, 2022, 7 pages.

Kilian Talo Theodor Singer, Interactions in an ultracold gas of Rydberg atoms, Oct. 2004, 133 pages.

Mao et al., A high-efficiency fiber-coupled Rydberg-atom integrated probe and its imaging applications, IEEE Antennas and Wireless Propagation Letters, 2022, 5 pages.

Meyer et al., Optimal Atomic Quantum Sensing using EIT Readout, Aug. 9, 2021, 12 pages.

Otto et al., Data capacity scaling of a distributed Rydberg atomic receiver array, Department of Physics, QSO-Centre for Quantum Science, and Dodd-Walls Centre, University of Otago, Dunedin, New Zealand, Apr. 8, 2021, 10 pages.

Prajapati et al., Enhancement of electromagnetically induced transparency based Rydberg-atom electrometry through population repumping, Aug. 31, 2021, 5 pages.

Prajapati et al., TV and Video Game Streaming with a Quantum Receiver: A Study on a Rydberg atom-based receiver's bandwidth and reception clarity, National Institute of Standards and Technology, May 13, 2022, 6 pages.

Renate Daschner, Addressable Rubidium vapor cells for optical and electrical read-out of Rydberg excitations, 2015, 195 pages.

Ripka et al., Rydberg atom-based radio frequency: hyperfine effects, Proc. SPIE 12016, Optical and Quantum Sensing and Precision Metrology II, 1201601, Mar. 2, 2022, 7 pages.

Simons et al., Continuous radio frequency electric-field detection through adjacent Rydberg resonance tuning, Oct. 9, 2021, 9 pages.

Simons et al., Using frequency detuning to improve the sensitivity of electric field measurements via electromagnetically induced transparency and Autler-Townes splitting in Rydberg atoms, Applied Physics Letters 108, 174101; doi: 10.1063/1.4947231, 2016, 6 pages.

Teale et al., Degenerate two-photon Rydberg atom voltage reference, AVS Quantum Sci. 4, 024403; https://doi.org/10.1116/5.0090892, Jun. 15, 2022, 6 pages.

Thaicharoen et al., Electromagnetically-induced transparency, absorption, and microwave field sensing in a Rb vapor cell with a three-color all-infrared laser system, May 27, 2019, 9 pages.

Van Ditzhuijzen et al., Simultaneous position and state measurement of Rydberg atoms, Eur. Phys. J. D 40, 13-17. DOI: 10.1140/epjd/e2006-00140-1, Jun. 21, 2006, 6 pages.

You et al., Microwave-field sensing via electromagnetically induced absorption of Rb irradiated by three-color infrared lasers, vol. 30, No. 10, Optics Express, May 9, 2022, 11 pages.

Arampatzis, Protecting the US Power Grid Against Foreign Threats, ITEGRITI Critical Infrastruture Protection, Sep. 6, 2022, 7 pages, https://itegriti.com/2022/compliance/protecting-the-US-power-grid-against-foreign-threats/.

Elben et al., The Randomized Measurement Toolbox, pp. 1-20, Mar. 21, 2022.

Gao et al., Solving DC Power Flow Problems Using Quantum and Hybrid Algorithms, Applied Soft Computing, vol. 137, Issue 110147, Jan. 13, 2022, 17 pages.

Giovannetti et al., Quantum enhanced positioning and clock synchronization, Nature 412, Issue 6845, Jul. 26, 2001, pp. 417-419.

Huang et al., Predicting Many Properties of a Quantum System from Very Few Measurements, pp. 1-40, Apr. 23, 2020.

Huang et al., Quantum Advantage in Learning from Experiments, Research Article, Quantum Computing, Science 376, 1182-1186 (2022) Jun. 10, 2022.

Ma et al., Quantum Spin Squeezing, Mar. 28, 2011.

(56) References Cited

OTHER PUBLICATIONS

Matsukevich et al., Quantum State Transfer Between Matter and Light, Science 306, Issue 5696, Oct. 22, 2004, pp. 663-666.

Moffat, Droop Control, Introduction to Electric Power Systems Lecture 12, Dec. 11, 2021, 5 pages.

National Science Foundation, How to Teleport Quantum Information from One Atom to Another, Research News, Feb. 25, 2009, 6 pages, https://new.nsf.gov/news/how-teleport-quantum-information-one-atom-another.

Saleem, Droop Control Mechanism in Power Generators, Apr. 20, 2023, 4 pages, https://energycentral.com/c/iu/droop-control-mechanism-power-generators-%F0%9F%A4%96.

Scott Aaronson, Shadow Shadow Tomography of Quantum States, pp. 1-29, Nov. 13, 2018.

Spizzirri, Quantum network between two national labs achieves record synch, Argonne National Laboratory, Jun. 27, 2022, 5 pages.

Stricker et al., Experimental Single-Setting Quantum State Tomography, pp. 1-34, May 31, 2022.

Takeda et al., Entanglement Swapping between Discrete and Continuous Variables, Phys. Rev. Lett., vol. 114, Issue 10, Mar. 9, 2015, 9 pages.

Virginia Tech, A Droop Controller is intrinsically a Phase-Locked Loop, 2013, 3 pages.

Voltage Disturbance, Calculating Phase Difference Between Two Waves, Jun. 22 2018, 2 pages, https://voltage-disturbance.com/power-quality/calculating-phase-difference-between-two-waves/.

Wikipedia, North American power transmission grid, Nov. 13, 2023, 6 pages, https://en.wikipedia.Org/w/index.php?title=North_American_power_transmission_grid&oldid=1192141374.

Xairos, Quantum Time Transfer, WSTS Presentation, Mar. 1, 2023, 33 pages.

Zyga, High-fidelity photon-to-atom quantum state transfer could form backbone of quantum networks, PHYS Org, Nov. 28, 2014, 5 pages, https://phys.org/news/2014-Il-high-fidelity-photon-to-atom-quantum-state-backbone.html.

* cited by examiner

WIDEBAND TUNABLE RYDBERG MICROWAVE DETECTOR

CROSS REFERENCE TO OTHER APPLICATIONS

This application claims priority to U.S. Provisional Patent Application No. 63/160,783 entitled WIDEBAND TUNABLE RYDBERG MICROWAVE ELECTROMETER filed Mar. 13, 2021 which is incorporated herein by reference for all purposes.

BACKGROUND OF THE INVENTION

Detection of microwaves (i.e. electromagnetic fields having a frequency in the range of approximately a few MHz through a few THz) has broad usage in communication and other technologies. Quantum detectors utilizing Rydberg atoms are capable of sensing microwaves with high sensitivity. Such detectors excite atoms to a first Rydberg state. A microwave signal incident on the Rydberg atoms and having a frequency corresponding to the energy difference between the first Rydberg state and a second Rydberg state results in a transition between the first and second Rydberg states. This change in the energy state of the Rydberg atom can be sensed, for example using electromagnetically induced transparency (EIT). Thus, the microwave is detected. Although possessing a high sensitivity, such a Rydberg microwave detector has limitations. Consequently, improved techniques for detecting electromagnetic fields, such as microwaves, are desired.

BRIEF DESCRIPTION OF THE DRAWINGS

Various embodiments of the invention are disclosed in the following detailed description and the accompanying drawings.

DETAILED DESCRIPTION

Figure 1:
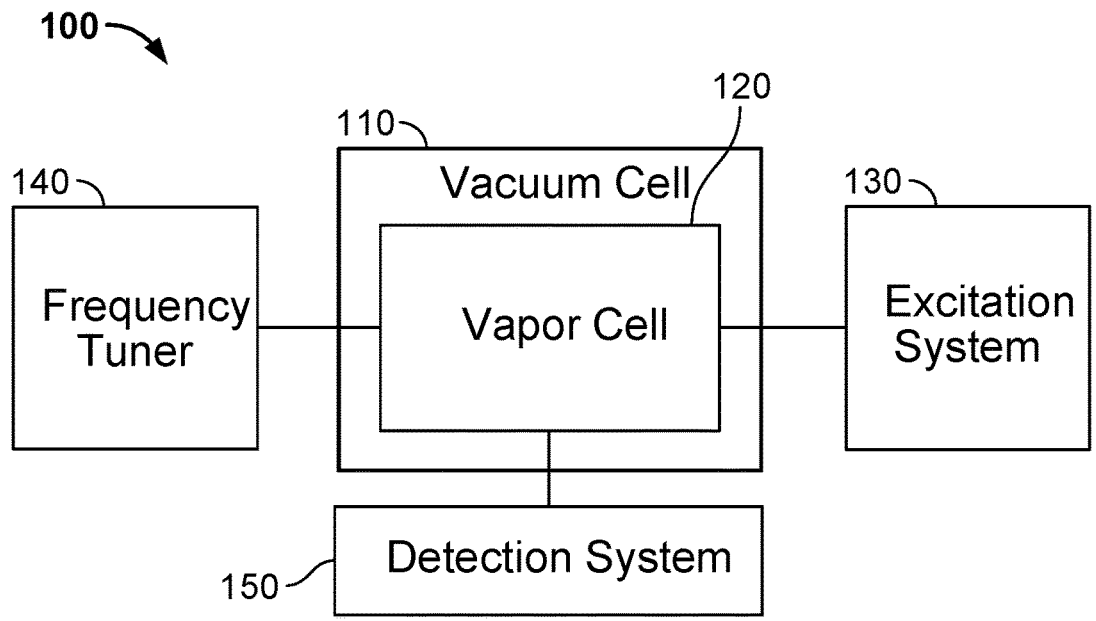
FIG. 1 is a block diagram of an embodiment of a tunable Rydberg electromagnetic field detector.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Rydberg microwave detectors may provide highly sensitive detection of microwaves (e.g. electromagnetic fields having a frequency of not less than a few MHz and not more than a few THz). In operation, quantum particles, such as neutral atoms, are excited to a high quantum number. The quantum number is typically on the order of one hundred and corresponds to a Rydberg state. Rydberg atoms (atoms excited to Rydberg states) generally possess large electric dipole moments. As a result, Rydberg atoms are highly susceptible to microwave induced changes in the electronic state. A microwave having a frequency corresponding to the energy between two Rydberg states can induce a transition between the states. The transition between the Rydberg states can be detected by a range of optical readout methods, such as Electromagnetically Induced Transparency (EIT). Rydberg microwave detection has a high sensitivity. For example, the technique may measure electromagnetic fields in the radio frequency range at a sensitivity on the order of $\sim 55$ $nVcm^{-1}Hz^{-1/2}$. Moreover, unlike antennas, the performance of Rydberg microwave detectors may not be limited by size. If an antenna occupies too small of a volume, the well-known Chu limit results in poor performance. In contrast, a Rydberg microwave sensor has no analogous size limitations with respect to the received microwave wavelength.

Although microwave detectors using Rydberg atoms may have high sensitivity, issues remain. For example, conventional Rydberg microwave detectors are capable of sensing microwaves only at frequencies within a small range. A conventional Rydberg microwave detector relies on the frequency of the detected microwave corresponding to an energy that is close or equal to the transition energy between two electronic (Rydberg) states. Electronic states of an atom have discrete levels. Thus, the transition energies are discrete. The range of transition energies is limited by the range of energy differences between energy levels. Thus, conventional Rydberg microwave detectors typically have a small bandwidth on the order of a few kHz. Accordingly, a mechanism for extending the utility of Rydberg microwave detectors is desired.

An electromagnetic field detector including a vapor cell, an excitation system, and a frequency tuner is described. The vapor cell has a plurality of quantum particles therein. The excitation system excites the quantum particles to a first Rydberg state. The first Rydberg state has a transition to a second Rydberg state at a first frequency. The frequency tuner generates a tunable field in a portion of the vapor cell. The tunable field shifts at least one of the first Rydberg state or the second Rydberg state (i.e. the first Rydberg state only, the second Rydberg state only, or the first Rydberg state and the second Rydberg state) such that the transition from the first Rydberg state to the second Rydberg state is at a second frequency different from the first frequency. The detection frequency range for the electromagnetic field detector is continuous and includes the first frequency and the second frequency. In some embodiments, the detection frequency range spans at least one gigahertz (GHz). In some embodiments, the detection frequency range spans at least ten GHz. In some embodiments, the detection frequency range may be at least one hundred GHz. For example, the detection frequency range may be continuous from a minimum frequency of at least 10 MHz through a maximum frequency of at least 100 GHz.

The frequency shifter may take various forms. In some embodiments, the frequency tuner includes an electric field shifter in the vapor cell. The electric field shifter generates a uniform electric field in the portion of the vapor cell that includes the quantum particles. Such an electric field shifter may include a plurality of parallel plates. Such a plate may be a thin film plate, a monolithic metallic plate, or include electrode sub-structures. In some embodiments, the frequency tuner includes a magnetic field shifter that generates a uniform magnetic field in the portion of the vapor cell. The magnetic field shifter further may include one or more electromagnets that provide a tunable magnetic field. The electromagnet(s) may have at detection aperture(s) or be otherwise configured such to allow an electromagnetic field to intersect the portion of the vapor cell that includes the quantum particles and the uniform magnetic field.

FIG. 1 is a block diagram of an embodiment of tunable Rydberg electromagnetic field detector 100. For clarity, only some portions of Rydberg electromagnetic field detector 100 are shown. In some embodiments, Rydberg electromagnetic field detector 100 is a microwave detector and may be utilized for some or all of the frequency range of microwaves described above. For example, Rydberg detector 100 may be capable of sensing electromagnetic fields having a frequency of at least ten MHz through at least 100 GHz. In some embodiments, Rydberg electromagnetic field detector 100 may detect electromagnetic fields having a frequency of up to a few THz. Other frequency ranges are possible. For example, Rydberg electromagnetic field detector 100 may have a detection frequency range of 1 GHz (e.g. from 10 GHz through 11 GHz), 10 GHz (e.g. 30 GHz through 40 GHz), or 100 GHz (e.g. 10 GHz through 110 GHz).

Rydberg electromagnetic field detector 100 includes vapor cell 120 residing in vacuum cell 110, excitation system 130, frequency tuner 140, and detection system 150. In some embodiments, vacuum cell 110 includes an ion pump or other pumping mechanism, a quantum particle source (e.g. a source of alkali atoms such as Cs or Rb atoms), an optical or other trap for maintaining the quantum particles in a desired region of vapor cell 120, and/or other components. Vapor cell 120 is an ultra-high vacuum (UHV) cell used to hold quantum particles, such as neutral Cs or Rb atoms. It is these quantum particles that are used by Rydberg electromagnetic field detector 100 for sensing electromagnetic fields (e.g. microwaves). Vapor cell 120 and vacuum cell 110 allow for transmission of electromagnetic fields into vapor cell 120. For example, vacuum cell 110 and/or vapor cell 120 may have one or more walls made of glass or another material that is transparent to microwaves. Consequently, the electromagnetic field desired to be detected can interact with the quantum particles of vapor cell 120. Vapor cell 120 is also transparent to energies used to excite the quantum particles to the Rydberg states. In some embodiments, vapor cell 120 may operate at room temperature and be small in size.

Excitation system 130 provides energy to excite the quantum particles in vapor cell 120 to the desired Rydberg state(s). For example, excitation system 130 may be a laser system including one or more coupling lasers. The coupling laser(s) provide to vapor cell 120 laser light that intersects a region of vapor cell 120 in which the quantum particles are retained. The laser light has the appropriate wavelength(s) for exciting these quantum particles from an initial electronic state to a high quantum number electronic state (i.e. a first Rydberg state). Although the term Rydberg states is used herein, the electronic states used may simply be sufficient to allow for detection of electromagnetic fields (e.g. microwaves) and for the desired frequency bandwidth. Thus, the electronic states of the quantum particles are sufficient to sense electromagnetic fields (e.g. via a large dipole moment) and to have the desired transition energies between electronic levels. A specific electronic state associated with a particular quantum number (e.g. one hundred) can, but may not, be used.

Detection system 150 is used to detect transitions between Rydberg states induced by the electromagnetic fields incident on the quantum particles in vapor cell 120. For example, detection system 150 may be an EIT system. Detection system 150 may include probe laser(s) that transmit laser light into vapor cell 120. The laser light is transmitted through vapor cell 120 in the absence of a detected electromagnetic field. Thus, a peak in intensity corresponding to the frequency of the laser light is detected. If the electromagnetic field induces a transition, then the laser light may undergo a peak splitting, transforming into Autler-Towns peaks. Thus, the presence of the electromagnetic field may be detected. Although detection system 150 and excitation system 130 are indicated as separate, the systems 130 and 150 may share one or more components. For example, the excitation laser of system 130 and the probe laser of system 150 may both be part of the same laser system. Thus, excitation system 130 may include both probe laser(s) and excitation laser(s).

Frequency tuner 140 generates a tunable field in a portion of vapor cell 120 in which some or all of the quantum particles reside. In some embodiments, the tunable field provided by frequency tuner 140 is a tunable electric field. In some embodiments, the tunable field is a tunable magnetic field. Other and/or additional fields are possible. The tunable field shifts the energy level of one or more of the Rydberg state(s). If frequency tuner 140 is not energized, then excitation system 130 excites quantum particles to a first Rydberg state. A transition between the first Rydberg state and a second Rydberg states is at a first frequency corresponding to a first energy. This first transition energy corresponds to an electromagnetic field resonance at the first frequency. If frequency tuner 140 is energized, then the first and/or second Rydberg states undergo an energy shift. As a result, the energy difference between the first and second Rydberg states changes. The transition between the first Rydberg state and the second Rydberg state is now at a second frequency (and thus a second energy) different from the first frequency (and thus the first energy). The frequency of the electromagnetic field resonance corresponding the transition has changed from the first frequency to the second frequency. The field provided by frequency tuner 140 is uniform in the region in vapor cell 120 occupied by the excited quantum particles. In some embodiments this region is substantially all of the interior of vapor cell 120 and/or includes substantially all of the quantum particles in vapor cell 120. Because the field is uniform, the quantum particles in the portion of vapor cell 120 are subject to the same field. The quantum particles exposed to the field undergo the same shift to within the desired tolerances. Further, once set, the field remains constant to within desired tolerance for the desired time. The tunable field may be set to various values, resulting in various frequencies of transition between the first and second Rydberg states. Consequently, the detection frequency range for electromagnetic field detector 100 is continuous and includes the first frequency and the second frequency.

Figure 2:
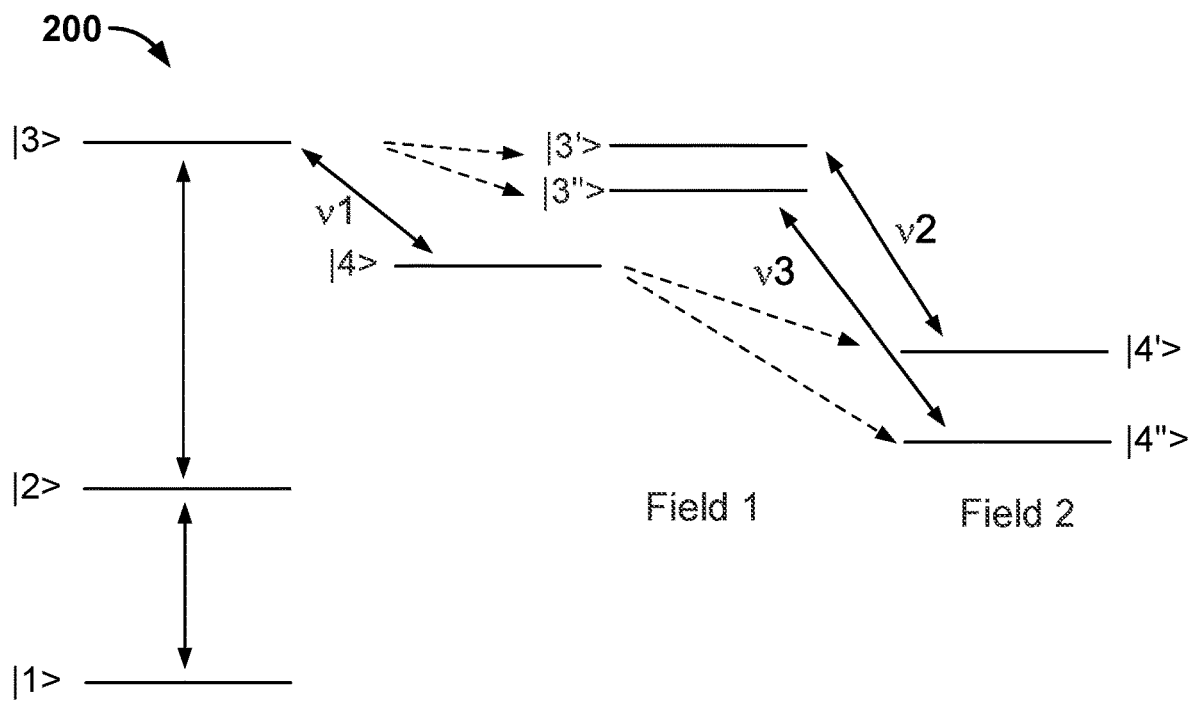
FIG. 2 is a diagram indicating the electronic states of quantum particles in an embodiment of a Rydberg electromagnetic field detector.

For example, FIG. 2 is a diagram 200 indicating the electronic states of quantum particles in an embodiment of a Rydberg electromagnetic field detector, such as Rydberg electromagnetic field detector 100. FIG. 2 is not to scale and is for explanatory purposes only. Thus, the energy states depicted are not intended to represent a particular quantum particle.

A quantum particle may have a number of quantum states, of which four are indicated: $|1\rangle$, $|2\rangle$, $|3\rangle$, and $|4\rangle$. An excitation system, such as system 140, excites the quantum particle to a first Rydberg state. For example, the neutral atom may be excited from state $|2\rangle$ to first Rydberg state $|3\rangle$. If frequency shifter 140 provides no field, the electromagnetic field resonance is at a frequency of $\nu 1$. The quantum particle may undergo a transition from first Rydberg state $|3\rangle$ to second Rydberg state $|4\rangle$ in response to an electromagnetic field (e.g. a microwave) having a frequency approximately equal to $\nu 1$ being incident on the quantum particle. This transition may be detected using detection system 150. Thus, electromagnetic fields at (or near) the first frequency can be detected.

A frequency tuner, such as frequency tuner 140, is energized to generate a first field in the region of the quantum particles. This first field results in a shift in the first Rydberg state to $|3'\rangle$ and a shift in the second Rydberg state to $|4'\rangle$. In other embodiments, only first Rydberg state $|3\rangle$ shifts. In other embodiments, only second Rydberg state $|4\rangle$ shifts. The energy difference between the shifted first Rydberg state $|3'\rangle$ and the second shifted Rydberg state $|4'\rangle$ corresponds to a new frequency, $\nu 2$. The electromagnetic field resonance at the first field is, therefore, at $\nu 2$. At this field, electromagnetic fields having a frequency corresponding to $\nu 2$ may be detected. More specifically, an electromagnetic field having the frequency at or near $\nu 2$ and incident on the quantum particle may induce a transition from $|3'\rangle$ to $|4'\rangle$. This transition may be detected using detection system 150. Thus, electromagnetic fields at (or near) the second frequency can be detected.

Frequency tuner 140 can be energized to provide a second, larger field. This larger field results in a shift in the first Rydberg state from $|3\rangle$ to $|3''\rangle$ and in the second Rydberg state from $|4\rangle$ to $|4''\rangle$. In other embodiments, only first Rydberg state $|3\rangle$ shifts. In other embodiments, only second Rydberg state $|4\rangle$ shifts. The energy difference between the shifted first Rydberg state $|3''\rangle$ and the second shifted Rydberg state $|4''\rangle$ corresponds to a new frequency, $\nu 3$. The electromagnetic field resonance at the second field is, therefore, at $\nu 3$. Electromagnetic fields having a frequency substantially equal to $\nu 3$ induce a transition from $|3''\rangle$ to $|4''\rangle$. This transition, and thus the electromagnetic field, may be detected using detection system 150.

The combination of excitation system 130 and frequency tuner 140 provides multiple frequencies for which an electromagnetic field can be detected by detection system 150. Thus, Rydberg electromagnetic field detector 100 has a detection range that includes at least frequencies $\nu 1$, $\nu 2$, and $\nu 3$. Moreover, the shifts in the energy levels to $|3'\rangle$, $|3''\rangle$, $|4'\rangle$ and $|4''\rangle$ are continuous and based on the tunable field provided by frequency tuner 140. As a result, the detection frequency range of Rydberg electromagnetic field detector 100 includes not only frequencies $\nu 1$, $\nu 2$, and $\nu 3$, but also frequencies between $\nu 1$ and $\nu 3$. The detection frequency range of Rydberg electromagnetic field detector 100 is thus continuous and has been extended to include a range of frequencies.

The range of a Rydberg electromagnetic field detector such as detector 100 may be further extended. Different principal quantum numbers and different Rydberg states may be selected to change the first Rydberg state and/or the second Rydberg state. This may be accomplished by exciting the quantum particles to different Rydberg states. By using other Rydberg states and/or other transitions in combination with the field applied by frequency tuner 140, the detection frequency range of Rydberg electromagnetic field detector 100 may be further extended. Thus, a wide bandwidth electromagnetic field detector that utilizes Rydberg atoms may be provided. For example, Rydberg detector 100 may be capable of sensing electromagnetic fields having a frequency of at least ten MHz through at least 100 GHz. In some such embodiments, Rydberg detector may detect electromagnetic fields having a frequency of up to approximately 1 THz. Other frequency ranges are possible. For example, Rydberg electromagnetic field detector 100 may have a detection frequency range of 1 GHz (e.g. from 10 GHz through 11 GHz), 10 GHz, or 100 GHz. As a result, the benefits of a Rydberg electromagnetic field detector, such as high sensitivity and smaller size, may be extended to a larger range of frequencies. Consequently, performance and usability of Rydberg electromagnetic field detector 100 may be enhanced.

Figure 3:
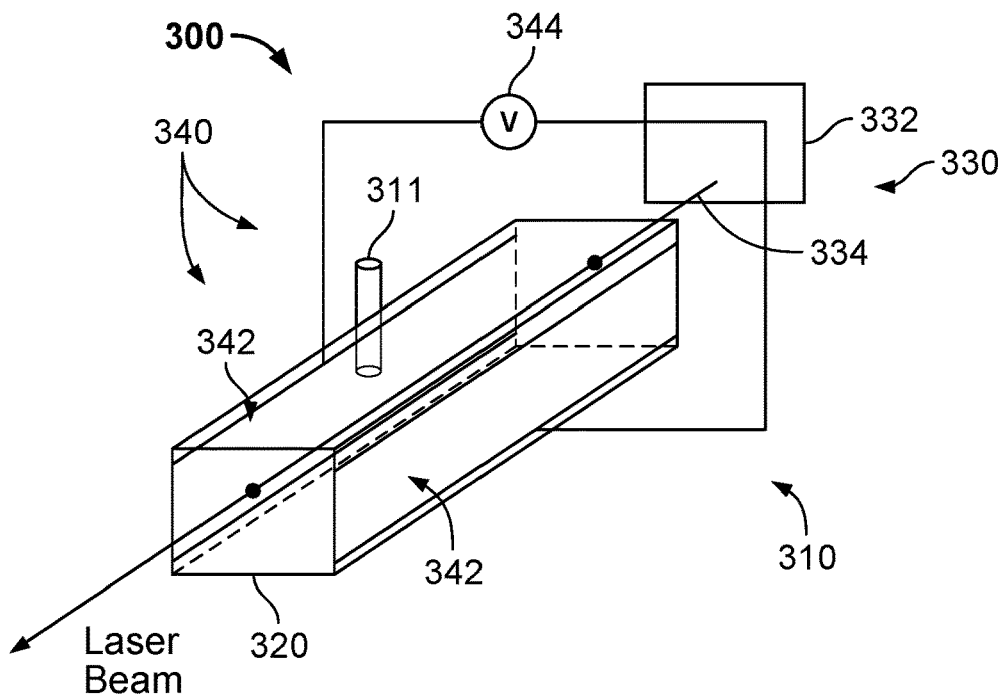
FIG. 3 is a diagram of an embodiment of a tunable Rydberg electromagnetic field detector utilizing an electric field shifter.

FIG. 3 is a diagram of an embodiment of tunable Rydberg electromagnetic field detector 300 utilizing an electric field shifter. For clarity, only some portions of Rydberg electromagnetic field detector 300 are shown. In some embodiments, Rydberg electromagnetic field detector 300 is a microwave detector and may be utilized for some or all of the frequency ranges of microwaves described above. For example, Rydberg electromagnetic field detector 300 may be capable of sensing electromagnetic fields having a frequency of at least ten MHz through at least 100 GHz (or at least 1 THz). Thus, detector 300 is referred to hereinafter as Rydberg microwave detector 300. Other frequency ranges are possible. In some embodiments, Rydberg microwave detector 300 may have a detection frequency range of 1 GHz, 10 GHz, or 100 GHz.

Rydberg microwave detector 300 includes vapor cell 320 residing in vacuum cell 310 (labeled but not explicitly shown), excitation system 330, frequency tuner 340, and a detection system (not shown) that are analogous to vapor cell 120 in vacuum cell 110, excitation system 130, frequency tuner 140, and detection system 150, respectively.

Rydberg microwave detector 300 may be configured and may operate in an analogous manner to Rydberg electromagnetic field detector 100. Excitation system 330 is shown as explicitly including laser system 332 that generates laser light 334 that passes through vapor cell 320. Laser light 334 excites the quantum particles (e.g. Rb or Cs atoms) to the desired Rydberg state(s). In some embodiments, probe laser(s) used in detecting microwaves may be part of laser system 332. The detection system (not shown) may use EIT or another analogous detection method. For example, a two-photon or multi-photon technique may be used for detection of microwaves.

Frequency tuner 340 is an electric field tuner. Thus, electric field tuner 340 generates a tunable electric field in a portion of vapor cell 320 in which some or all of the quantum particles reside. Electric field tuner 340 includes electrodes 342 and voltage source 344. In the embodiment shown, electrodes 342 are within vapor cell 310 and are parallel plates. Thus, the electric field generated between parallel plates 342 is uniform through a significant fraction of vapor cell 320. Further, once set, the electric field remains constant to within desired tolerance for the desired time. In some embodiments, electrodes 342 and/or another portion (not shown) of frequency tuner 340 may be configured to reduce fringing or stray fields from electrodes 342. In some embodiments, electrodes 342 are monolithic structures. For example, electrodes 342 may be continuous metal plates or a continuous thin film that may be deposited on the interior walls of vapor cell 320. In some embodiments, electrodes 342 may have another configuration, particularly another configuration that results in a uniform field in the vapor cell 320. Electrodes 342 may also include electrode substructures. For example, each of the electrodes 342 may include multiple plates each of which occupies only a portion of the interior walls of vapor cell 320 or may be formed into other shapes that provide the uniform field in the desired region. In addition, although two parallel plates 342 on opposing interior walls of vapor cell 320 are shown, additional plates and/or plates having other locations may be used. In alternate embodiments, electrodes 342 may be outside of vapor cell 320.

Figure 4:
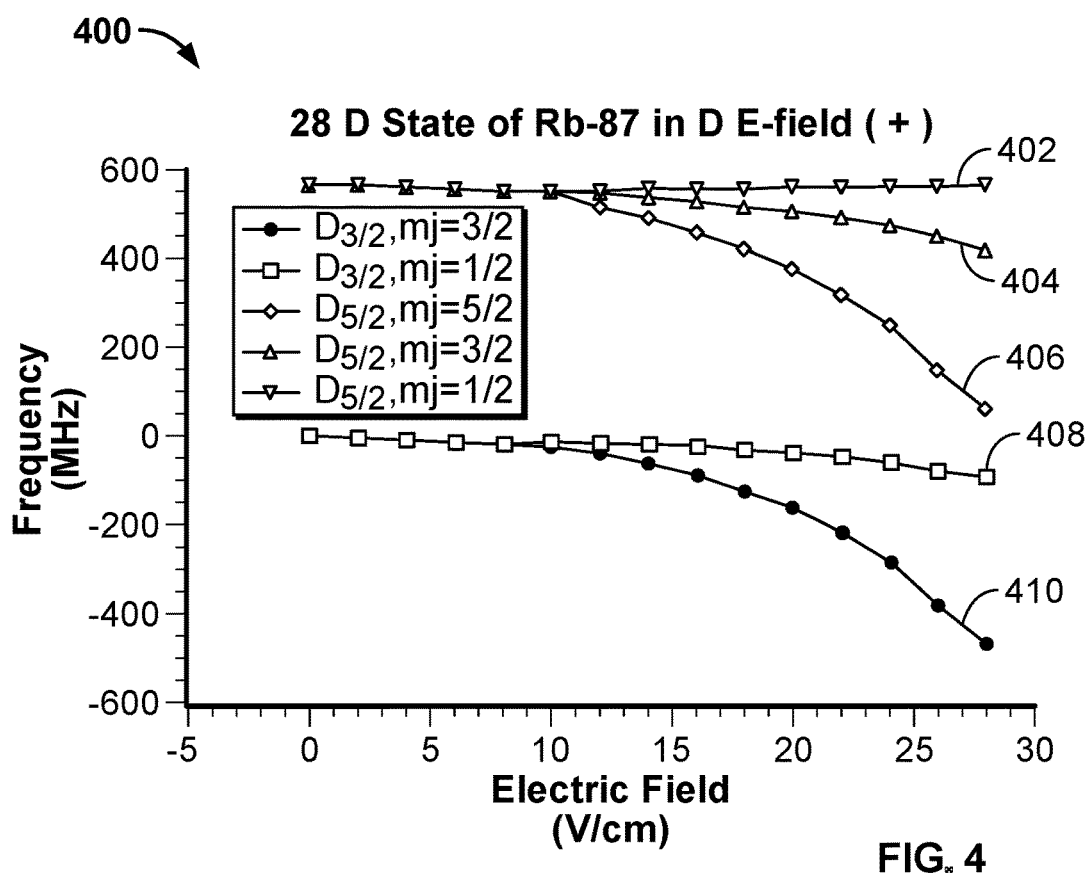
FIG. 4 is a diagram indicating the shift in tunable Rydberg states in response to an electric field in an embodiment of a Rydberg electromagnetic field detector.

The electrodes 342 generate a tunable, uniform electric field that shifts the Rydberg states and, therefore, the microwave resonance that is determined by the frequency for transitions between adjacent Rydberg states. The electric field generated by electrodes 342 tunes the microwave resonance between Rydberg states without mode hopping on frequencies. For example, FIG. 4 is a diagram indicating the shift in tunable Rydberg states that may occur in response to a tunable electric field generated by electric field tuner 340. FIG. 4 is a graph 400 indicating splitting of Rydberg states, 28 $D_{5/2}$ and 28 $D_{3/2}$ states of Rb-87 atoms, under the influence of an electric field. The splitting of the Rydberg states is due to a DC Stark effect on Rydberg states in a uniform, constant electric field. Plots 402, 404, and 406 indicate the splitting of the $28D_{5/2}$ state, while plots 408 and 410 indicate the splitting of the $28D_{3/2}$ state. Other Rydberg states may have analogous splittings due to an applied electric field. As indicated by the nature of plots 402, 404, 406, 408, and 410, the shift of the Rydberg states is continuous with changes in the electric field.

Figure 5:
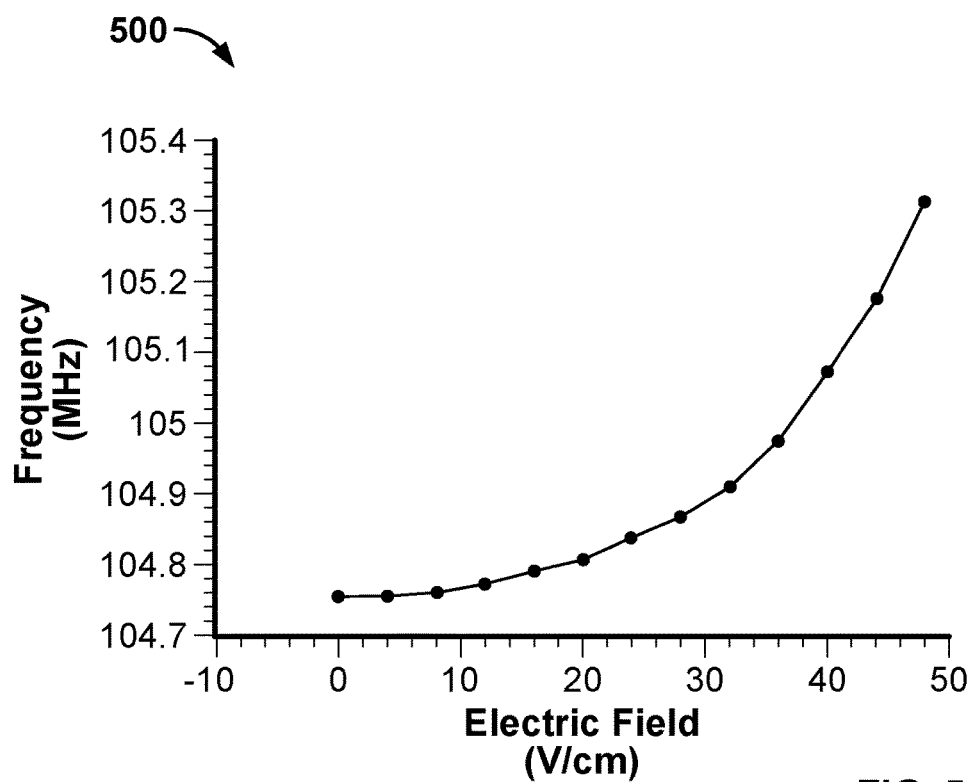
FIG. 5 is a diagram indicating the transition energies usable for microwave detection in an embodiment of a tunable Rydberg electromagnetic field detector.

Electric field tuner 340 may provide continuous changes in the Rydberg states and, therefore, continuously varying microwave resonant frequencies for transitions between Rydberg states. For example, FIG. 5 is a diagram indicating the transition energy usable for microwave detection in an embodiment of a tunable Rydberg electromagnetic field detector, such as Rydberg microwave detector 300. Graph 500 indicates the microwave coupling from 28 $D_{5/2}$ to 29 $P_{3/2}$, under DC electric fields. As the electric field applied to the quantum particles increases, the frequency of the transition increases. For graph 500, the range of the resonance shown covers a detection frequency range from 104.8 to 105.4 GHz. This detection frequency range may be extended using a larger electric field range and/or additional Rydberg states. Thus, the combination of multiple principal quantum numbers, changes to the Rydberg states to which the quantum particles are excited, and/or variations in the applied electric field, the detection frequency band may be increased. Thus, the DC Stark effect may be used to manipulate the frequency of RF resonance to expand the frequency range of the RF sensing using Rydberg atoms.

For example, Table 1 indicates a variety of atomic transitions of Cs atoms that may be used to obtain a frequency range from 100 MHz (0.1 GHz) through 100 GHz. Three laser frequencies may be used for Cs atoms, 852 nm ($6S_{1/2} \rightarrow 6P_{3/2}$), 697 nm ($6P_{3/2} \rightarrow 7D_{5/2}$), and 1890 nm ($7D_{5/2} \rightarrow nF_{7/2}$), to cover the entire frequency range from 10 MHz-100 GHz. This may be achieved by slightly varying the coupling laser frequency at 1890 nm and applying an electric field using electric field tuner 340. Some portions of the range utilize transitions only in the presence of an applied field (e.g. the frequency range 35 GHz-2 GHz). Thus, in some embodiments, the entire frequency range of Rydberg microwave detector 300 may use only transitions that occur in the presence of the applied field. In some embodiments, the entire frequency range of Rydberg microwave detector 300 may use transitions that occur in the presence of the applied field as well as transitions that occur in the absence of an applied field (i.e. the applied electric field is 0 V/cm).

TABLE 1

| Atomic Transition | λc(nm) | Applied Electric Field | Detection Frequency Range |
|---|---|---|---|
| $43D_{5/2}$-$50F_{7/2}$ | 1897.9 | 0 V/cm-18 V/cm | 58 GHz-100 GHz |
| $51D_{5/2}$-$48F_{7/2}$ | 1890.4 | 0 V/cm-7.5 V/cm | 35 GHz-58 GHz |
| $42D_{5/2}$-$43F_{7/2}$ | 1894.6 | 1.2 V/cm-12.5 V/cm | 35 GHz-2 GHz |
| $42G_{7/2}$-$42F_{7/2}$ | 1895.6 | 0 V/cm-1.75 V/cm | 2 GHz-0.5 GHz |
| $70G_{7/2}$-$70F_{7/2}$ | 1881.4 | 0 V/cm-0.15 V/cm | 0.5 GHz-0.01 GHz |

Similar techniques can be applied to other Rydberg atoms in any multiphoton transition with different laser and transition frequencies. In general, the electric field applied by electric field tuner 340 is desired to be restricted to the region where the frequency of the microwave resonance changes monotonically with the applied electric field.

There may be situations for which the principal quantum number used by Rydberg microwave detector 300 is altered to cover a larger or different frequency range. The tuning time for such a Rydberg microwave detector 300 can be shortened with complex optical frequency control schemes. Such schemes may increase the cost and/or size of Rydberg microwave detector 300. For fast detuning of the sensing frequency, Rydberg microwave detector 300 can receive and process arbitrary waveforms with multiple frequencies and large dynamic range. The electromagnetic fields with wideband background clutter in combination with multiple amplitude of signals, such as GPS, Digital Television, and a frequency hopping waveform, can be detected, and processed as a function of the electric field amplitude and for the user to interpret the spectral environment.

In some embodiments, vapor cell 320 and thus detector 300 may be compact. For example, vapor cell 310 may be on the order of 1 cm-10 cm long, with a gap between electrodes 342 of 1-10 mm and an internal width of 1 mm-20 mm internal. An aspect ratio of 10:1 length to gap may be utilized for a uniform electric field influencing the atoms in the interaction region. In some embodiments, vacuum cell 310 includes walls 200 micrometers through 5 mm thick that are made nominally of glass. In some embodiments, undoped silicon, aluminosilicate glasses, and/or other materials may be used. Electrodes 342 are inside (e.g. on or affixed to the inner surfaces of) vapor cell 320. This reduces shielding effects and/or other artifacts of the construction or materials. In some embodiments, electrodes 342 may be formed of a low magnetic (or nonmagnetic) stainless steel. However, other conductors that exhibit the desired properties, such as limited chemical interaction with the gas or other deleterious effects when used in Rydberg microwave detector 300, may be used. For example, a platinum coating on the inner walls of vapor cell 320 or on a plate may be used. Further transparent conductors may be used for electrodes 342 in part or in whole, with or without a protecting or a metallic layer.

In some embodiments, indium tin oxide (ITO) may be used for electrical feedthroughs by bonding the walls of vapor cell 320 with electrodes 342. The cell may be sealed via hydroxide, contact, or anodic bonding. In some embodiments, sealing may be performed by flowing a frit or other gap filling material to form hermetic seals over the ITO conductors. Utilizing such a bonding scheme may allow vapor cell 320 to have two opposing parallel field plates that are individually addressable and utilize at least three pieces of glass or cell material. In some embodiments, two parallel windows (or plates) have corresponding parallel plate electrodes 342 deposited thereon in part or function as the parallel plate electrodes 342. A central cavity formed in vapor cell 320 provides the vapor cavity in which the quantum particles are retained. The plates are sealed to form vapor cell 320. A tipoff tube or pumpout tube 311 may also be used to evacuate and vacuum process vapor cell 320. In some embodiments, vapor cell 320 may be vacuum processed and assembled entirely within another vacuum chamber.

Rydberg microwave detector 300 may have improved performance. Because it utilizes Rydberg atoms for detection, Rydberg microwave detector 300 may be highly sensitive. Moreover, using the DC Stark field shift induced by electrodes 342, the frequency range of Rydberg microwave detector 300 may be extended. By selecting different principal quantum numbers and different Rydberg states, the detection frequency range of Rydberg microwave detector 300 may be further extended. Thus, a wide bandwidth microwave detector that utilizes Rydberg atoms may be provided. Because electrodes 342 are within vapor cell 320, the low frequency electric field screening effect that may be caused by the alkali-metal atoms adsorbed on the inner surface of vapor cell 320 can be reduced or eliminated. Performance of microwave detection may thus be improved. In addition, electrodes 342 generating the electric fields may not impact cell transmission, sensitivity, or the ability to create arrays of sensors. Such electrodes 342 may be metallic plates, thin films, or have another configuration. Thus, Rydberg microwave detector 300 may tune the detection frequency over a wide band, reduce or eliminate electric field screening, and ensure optical transparency so that laser beams such as laser beam 332 can pass through vapor cell 320 to interaction with atoms retained therein.

Figure 6:
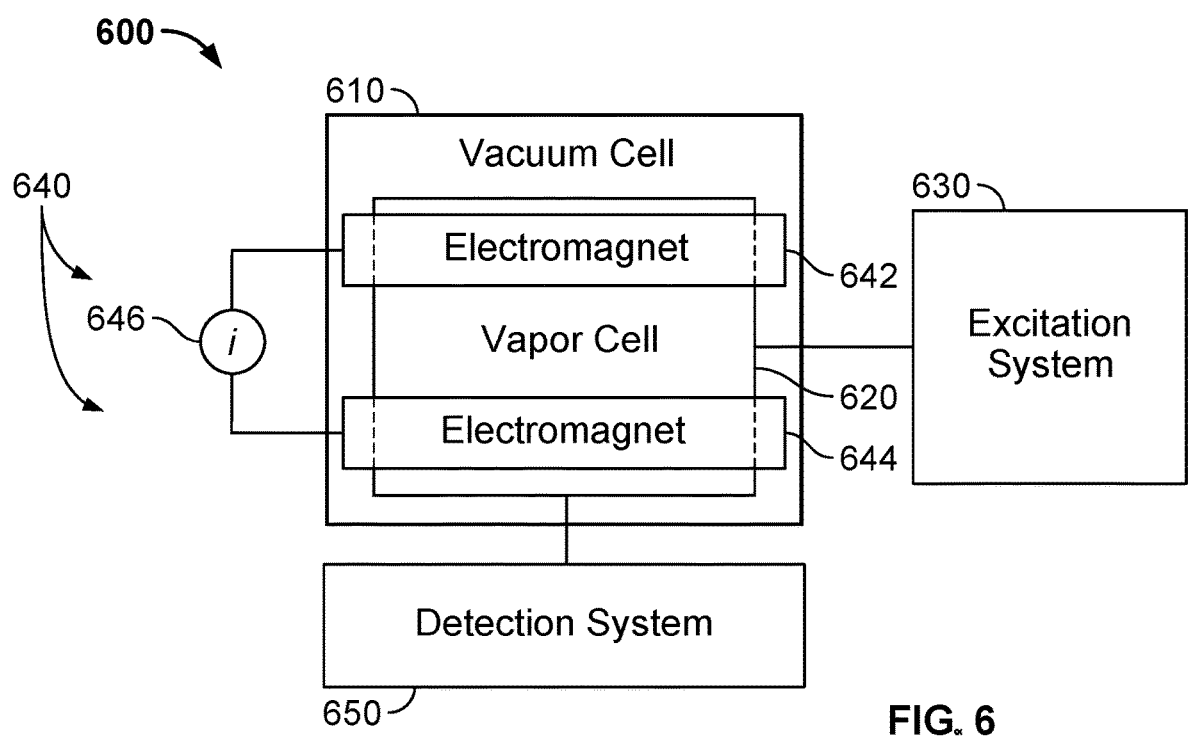
FIG. 6 is a block diagram of an embodiment of a tunable Rydberg electromagnetic field detector utilizing a magnetic field shifter.

FIG. 6 is a block diagram of an embodiment of tunable Rydberg electromagnetic field detector 600 utilizing a magnetic field shifter. For clarity, only some portions of Rydberg electromagnetic field detector 600 are shown. In some embodiments, Rydberg electromagnetic field detector 600 is a microwave detector and may be utilized for some or all of the frequency ranges of microwaves described above. For example, Rydberg electromagnetic field detector 600 may be capable of sensing electromagnetic fields having a frequency of at least ten MHz through at least 100 GHz (or at least 1 THz). Thus, detector 600 is referred to hereinafter as Rydberg microwave detector 600. However, other frequency ranges are possible. In some embodiments, Rydberg microwave detector 600 may have a detection frequency range of 1 GHz, 10 GHz, or 100 GHz.

Rydberg microwave detector 600 includes vapor cell 620 residing in vacuum cell 610, excitation system 630, frequency tuner 640, and detection system 650 that are analogous to vapor cell 120 in vacuum cell 110, excitation system 130, frequency tuner 140, and detection system 150, respectively. Rydberg microwave detector 600 may be configured and may operate in an analogous manner to Rydberg electromagnetic field detector 100. For example, excitation system 630 may provide laser light used to excite quantum particles (e.g., Rb or Cs atoms) to the desired Rydberg state(s). In some embodiments, probe laser(s) used as part of detection system 650 may be part of a laser system in excitation system 630. Detection system 650 may use EIT or another analogous detection method. For example, a two-photon or multi-photon technique may be used.

Frequency tuner 640 is a magnetic field tuner. Thus, magnetic field tuner 640 generates a tunable magnetic field in a portion of vapor cell 620 in which some or all of the quantum particles reside. Magnetic field tuner 640 includes electromagnets 642 and 644 (e.g. coils) and current source 646. In the embodiment shown, two electromagnets 642 and 644 are shown. In another embodiment, another number of electromagnet(s) may be used. In addition, electromagnets 642 and 644 are configured to allow optical and microwave access to the quantum particles in vapor cell 620. For example, an aperture may be considered to exist between electromagnets 642 and 644 or along the axes of electromagnets 642 and 644. Electromagnets 642 and 644 generate a uniform magnetic field in the region of vapor cell 620 in which the quantum particles reside. In some embodiments, the magnetic field is uniform through a significant fraction of vapor cell 320. Once set, the magnetic field is also constant to within desired tolerances. In some embodiments, electromagnets 642 and 644 are outside of vapor cell 620. In other embodiments, electromagnet 642 and/or 644 may be inside vapor cell 620. Similarly, in some embodiments, electromagnets 642 and 644 are outside of vacuum cell 610. In other embodiments, electromagnetic 642 and/or 644 may be inside vacuum cell 610.

The electromagnets 642 and 644 generate a tunable, uniform magnetic field that shifts the Rydberg states and, therefore, the microwave resonance that is determined by the frequency for transitions between the Rydberg states. The magnetic field generated by electromagnets 642 and 644 thus tunes the microwave resonance between Rydberg states. The shift of the Rydberg states is continuous with changes in the magnetic field. Magnetic field tuner 640 may provide continuous changes in the Rydberg states and, therefore, continuously varying microwave resonant frequencies for transitions between Rydberg states. The combination of multiple principal quantum numbers, changes to the Rydberg states to which the quantum particles are excited, and variations in the applied magnetic field, the detection frequency band may be increased.

Rydberg microwave detector 600 may have improved performance. Because it utilizes Rydberg atoms for detection, Rydberg microwave detector 600 may be highly sensitive. Due to a shift induced by the magnetic field generated by electromagnets 642 and 644, the frequency range of Rydberg microwave detector 600 may be extended. By selecting different principal quantum numbers and different Rydberg states, the detection frequency range of Rydberg microwave detector 600 may be further extended. Thus, Rydberg microwave detector 600 may tune the detection frequency over a wide band and ensure optical transparency so that laser light and other electromagnetic fields (e.g. microwaves) can pass through vapor cell 620 to interaction with atoms retained therein.

Figure 7:
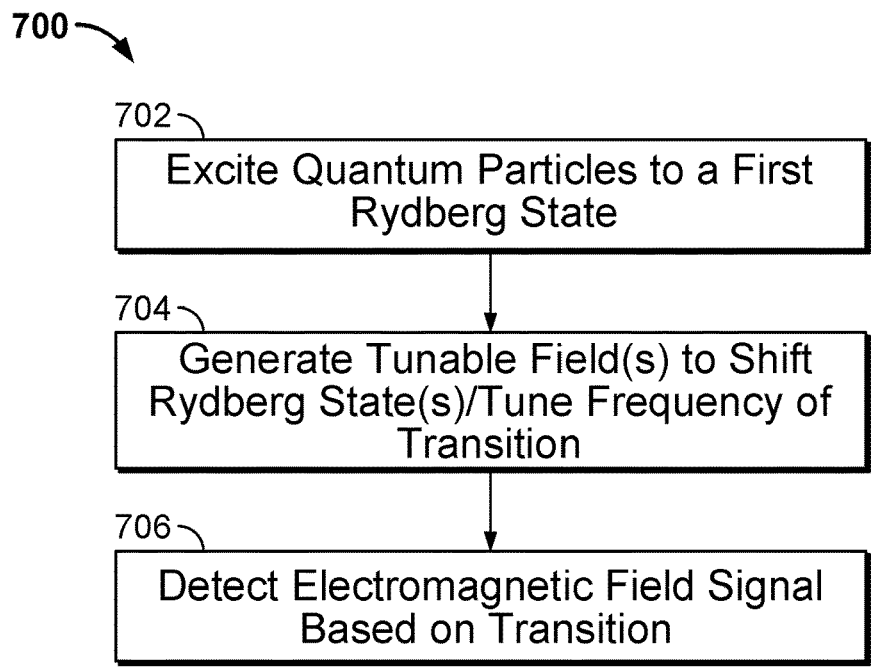
FIG. 7 is a flow chart depicting an embodiment of a method for sensing electromagnetic fields using a tunable Rydberg electromagnetic field detector.

FIG. 7 is a flow chart depicting an embodiment of method 700 for sensing electromagnetic fields using a tunable Rydberg electromagnetic field detector. For simplicity only some steps are shown. Thus, the processes of method 700 may be performed in another order including but not limited to wholly or partially in parallel.

Quantum particles in a vapor cell of an electromagnetic field detector are excited to a first Rydberg state, at 702. In some embodiments, 702 may include utilizing one or more wavelengths of laser light to excite the quantum particles to the first Rydberg state. The quantum particles may transition from the first Rydberg state to a second Rydberg state. This transition is characterized by a first frequency. Tunable field(s), such as an electric and/or magnetic field, are generated in the region of the vapor cell that the quantum particles are, at 704. The field(s) induce shift(s) in the first and/or second Rydberg state(s). Thus, the frequency of the transition between the first and second Rydberg states changes to a second frequency. This second frequency corresponds to the electromagnetic field resonance. An electromagnetic field intersecting the portion of the vapor cell where the quantum particles and field(s) are and having a frequency corresponding to the second frequency is detected, at 706. Thus, the detection frequency range for method 700 is extended to include the first and second frequencies.

For example, quantum particles in vapor cell 120 of Rydberg electromagnetic field detector 100 are excited to a first Rydberg state by excitation system 130, at 702. Frequency tuner 140 generates field(s) (e.g. electric and/or magnetic field(s)) in the region of the quantum particles, at 704. The field(s) in this region are desired to be uniform so that the Rydberg states of the quantum particles are shifted in substantially the same way. Thus, the electromagnetic field resonance of the transition from the first Rydberg state to a second Rydberg state has been shifted. At 706, an electromagnetic field having a frequency corresponding to this electromagnetic field resonance is detected using detection system 150, at 706.

Using method 700, electromagnetic fields such as microwaves may be detected with high precision. Further, the frequency bandwidth of detection may be large. In some embodiments, the frequency bandwidth of method 700 is analogous to the frequency bandwidth of Rydberg electromagnetic field detector 100. Thus, method 700 may tune the detection frequency over a wide band to provide detection of electromagnetic fields over this band.

Figure 8:
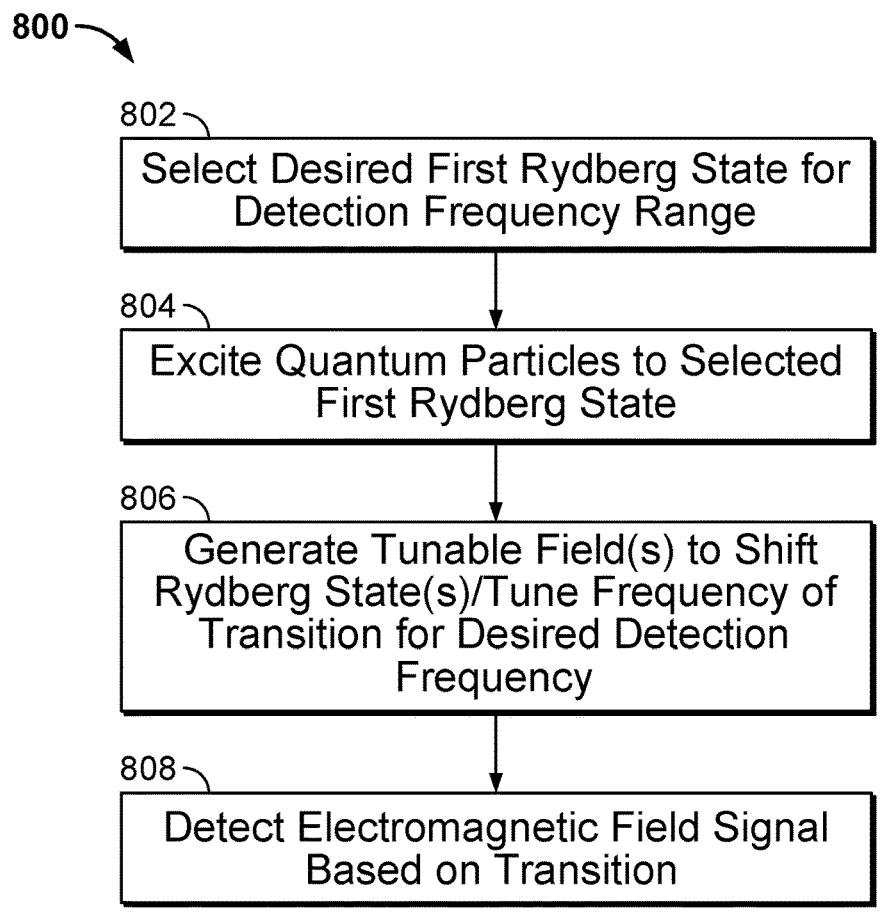
FIG. 8 is a flow chart depicting an embodiment of a method for sensing electromagnetic fields using a tunable Rydberg electromagnetic field detector.

FIG. 8 is a flow chart depicting an embodiment of method 800 for sensing electromagnetic fields using a tunable Rydberg electromagnetic field detector. For simplicity only some steps are shown. Thus, the processes of method 800 may be performed in another order including but not limited to wholly or partially in parallel.

The first Rydberg state for detection of the desired frequency range is selected, at 802. Selection at 802 may include selecting the principle quantum number for the quantum particles being used as well as the energy level to which the quantum particles are to be excited.

Quantum particles in a vapor cell of an electromagnetic field detector are excited to the first Rydberg state, at 804. In some embodiments, 804 is analogous to 702. Tunable field(s), such as an electric and/or magnetic field, are generated in the region of the vapor cell that the quantum particles are, at 806. In some embodiments, 806 is analogous to 704. The field(s) induce shift(s) in the Rydberg state(s). Thus, the frequency of the transition between the first Rydberg state and a second Rydberg state changes to a second frequency. An electromagnetic field intersecting the portion of the vapor cell where the quantum particles and field(s) are and having a frequency corresponding to the second frequency is detected, at 808. In some embodiments, 808 is analogous to 706. Thus, the detection frequency range for method 800 is extended to include the first and second frequencies.

For example, the currently desired detection frequency range may be 35 GHz-58 GHz. Thus, for Rydberg microwave detector 300, the $43D_{5/2}$ state may be selected as the first Rydberg state, at 802. The corresponding second Rydberg state is $48F_{1/2}$, as indicated in Table 1. quantum particles in vapor cell 320 of Rydberg microwave detector 100 are excited to the first Rydberg state by excitation system 330, at 804. Electric field tuner 340 generates an electric field in the region of the quantum particles, at 806. This field may be in the range of 0 V/cm through 7.5 V/cm. In embodiments in which Rydberg microwave detector 600 is used, a magnetic field is generated. Thus, the electromagnetic field resonance of the transition from the first Rydberg state to a second Rydberg state has been shifted. At 808, an electromagnetic field having a frequency corresponding to this electromagnetic field resonance is detected using a detection system, at 808.

Using method 800, electromagnetic fields such as microwaves may be detected with high precision. Further, the frequency bandwidth of detection may be large. In some embodiments, the frequency bandwidth of method 800 is analogous to the bandwidth of Rydberg electromagnetic field detector 100. Thus, method 800 may tune the detection frequency over a wide band to provide detection of electromagnetic fields over this band.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A wideband-tunable microwave detector comprising:
   quantum particles;
   a laser system configured to transition the quantum particles to a first Rydberg state of a first Rydberg pair of Rydberg states;
   a field controller configured to control a field strength of a field at the quantum particles so as to control a resonant frequency for a transition between the first Rydberg state and a second Rydberg state of the first Rydberg pair;
   a tuner coupled to the field controller for selecting a microwave detection frequency (MDF) by controlling the field strength; and a detector system that detects microwaves of a selected MDF based on a distribution of Rydberg states between the first Rydberg state and the second Rydberg state of the first Rydberg pair.

2. The wideband-tunable microwave detector of claim 1 wherein:
the laser system is configured to transition quantum particles to a selected first Rydberg state of plural first Rydberg states, the selected first Rydberg state belonging to a selected Rydberg pair of plural Rydberg pairs of Rydberg states, the plural first Rydberg states including the first Rydberg state of the first Rydberg pair;
the field controller is configured to control a field strength of a field at the quantum particles so as to control a resonant frequency for a transition between the first Rydberg state and a second Rydberg state of each of plural Rydberg pairs of Rydberg states, the plural Rydberg pairs including the first Rydberg pair;
wherein the tuner is configured to select the MDF from a full MDF range, each MDF of the full MDF range being selectable by selecting a selected field strength and a selected Rydberg pair of the plural Rydberg pairs, each Rydberg pair corresponding to a respective one of plural sub-ranges of the full MDF range, different Rydberg pairs corresponding to different sub-ranges, the tuner being coupled to the laser system for transitioning quantum particles to the first Rydberg state of the selected Rydberg pair, the tuner being coupled to the field controller for selecting the selected field strength to select the MDF from a sub-range corresponding to the selected Rydberg pair; and
the detector system is configured to detect microwaves of a selected MDF based on a distribution of Rydberg states between the Rydberg states of the selected Rydberg pair.

3. The wideband-tunable microwave detector of claim 2 wherein the full MDF range is continuous.

4. The wideband-tunable microwave detector of claim 2 wherein each sub-range intersects at least one other sub-range.

5. The wideband-tunable microwave detector of claim 4 wherein:
a first Rydberg pair of the Rydberg pairs of Rydberg states includes a $70G_{7/2}$ Rydberg state and a $70F_{7/2}$ Rydberg state;
a second Rydberg pair of the Rydberg pairs of Rydberg states includes a $42G_{7/2}$ Rydberg state and a $42F_{7/2}$ Rydberg state;
a third Rydberg pair of the Rydberg pairs of Rydberg states includes a $42D_{5/2}$ Rydberg state and a $43F_{7/2}$ Rydberg state;
a fourth Rydberg pair of the Rydberg pairs of Rydberg states includes a $51D_{5/2}$ Rydberg state and a $48F_{7/2}$ Rydberg state; and
a fifth Rydberg pair of Rydberg states includes a $43D_{5/2}$ Rydberg state and a $50F_{7/2}$ Rydberg state.

6. The wideband-tunable microwave detector of claim 5 wherein:
the first Rydberg pair corresponds to a first sub-range that extends from 10 megahertz (MHz) to 0.5 gigahertz (GHz);
the second Rydberg pair corresponds to a second sub-range that extends from 0.5 GHz to 2 GHz so as to intersect the first sub-range at 0.5 GHz;
the third Rydberg pair corresponds to a third sub-range that extends from 2 GHz to 35 GHz so as to intersect the second sub-range at 2 GHz;
the fourth Rydberg pair corresponds to a fourth sub-range that extends from 35 GHz to 58 GHz so as to intersect the third sub-range at 35 GHz; and
the fifth Rydberg pair corresponds to a fifth sub-range that extends from 58 GHz to 100 GHz so that it intersects the fourth sub-range at 58 GHz, the full MDF range being 10 megahertz to 100 GHz.

7. The wideband-tunable microwave detector of claim 6 wherein the field is an electric field with an electric field strength range at the quantum particles of 0-0.15 volts/centimeter (V/cm) for the first sub-range, 0-1.75 V/cm for the second sub-range, 1.2-12.5 V/cm for the third sub-range, 0-7.5 cm V/cm for the fourth sub-range, and 0-18 V/cm for the fifth sub-range.

8. The wideband-tunable microwave detector of claim 2 wherein the full MDF range is greater than 42 GHz.

9. The wideband-tunable microwave detector of claim 2 wherein the field includes an electric field and the field controller includes a plurality of parallel plates.

10. The wideband-tunable microwave detector of claim 2 wherein the field includes a magnetic field.

11. A wideband-tunable microwave detection process comprising:
selecting a microwave detection frequency (MDF) by selecting a field strength at quantum particles of a field;
transitioning quantum particles to a selected Rydberg state of a selected Rydberg pair of Rydberg states; and
detecting microwaves having the selected MDF based on a Rydberg state distribution between a first Rydberg state of the selected Rydberg pair and a second Rydberg state of the selected Rydberg pair.

12. The wideband-tunable microwave detection process of claim 11 wherein the MDF is selected from a full MDF range of MDFs by selecting a combination of a field strength at the quantum particles and the selected Rydberg pair, the selected Rydberg pair being selected from plural Rydberg pairs of Rydberg states, each of the Rydberg pairs corresponding to one of plural sub-ranges of the full MDF range such that different sub-ranges correspond to different Rydberg pairs.

13. The wideband-tunable microwave detection process of claim 12 wherein the full MDF range is continuous.

14. The wideband-tunable microwave detection process of claim 13 wherein each sub-range intersects at least one other sub-range.

15. The wideband-tunable microwave detection process of claim 14 wherein:
a first Rydberg pair of the Rydberg pairs of Rydberg states includes a $70G_{7/2}$ Rydberg state and a $70F_{7/2}$ Rydberg state;
a second Rydberg pair of the Rydberg pairs of Rydberg states includes a $42G_{7/2}$ Rydberg state and a $42F_{7/2}$ Rydberg state;
a third Rydberg pair of the Rydberg pairs of Rydberg states includes a $42D_{5/2}$ Rydberg state and a $43F_{7/2}$ Rydberg state;
a fourth Rydberg pair of the Rydberg pairs of Rydberg states includes a $51D_{5/2}$ Rydberg state and a $48F_{7/2}$ Rydberg state; and
a fifth Rydberg pair of Rydberg states includes a $43D_{5/2}$ Rydberg state and a $50F_{7/2}$ Rydberg state.

16. The wideband-tunable microwave detection process of claim 15 wherein:
the first Rydberg pair corresponds to a first sub-range that extends from 10 megahertz (MHz) to 0.5 gigahertz (GHz);

the second Rydberg pair corresponds to a second sub-range that extends from 0.5 GHz to 2 GHz so as to intersect the first sub-range at 0.5 GHz;

the third Rydberg pair corresponds to a third sub-range that extends from 2 GHz to 35 GHz so as to intersect the second sub-range at 2 GHz;

the fourth Rydberg pair corresponds to a fourth sub-range that extends from 35 GHz to 58 GHz so as to intersect the third sub-range at 35 GHz; and the fifth Rydberg pair corresponds to a fifth sub-range that extends from 58 GHz to 100 GHz so that it intersects the fourth sub-range at 58 GHz, the full MDF range being 10 MHz to 100 GHz.

17. The wideband-tunable microwave detection process of claim 16 wherein the field is an electric field with an electric field strength range at the quantum particles of 0-0.15 volts/centimeter (V/cm) for the first sub-range, 0-1.75 V/cm for the second sub-range, 1.2-12.5 V/cm for the third sub-range, 0-7.5 cm V/cm for the fourth sub-range, and 0-18 V/cm for the fifth sub-range.

18. The wideband-tunable microwave detection process of claim 12 wherein the full MDF range is greater than 42 GHz.

19. The wideband-tunable microwave detection process of claim 11 wherein the field includes an electric field, the electric field being controlled using a plurality of parallel plates.

20. The wideband-tunable microwave detection process of claim 11 wherein the field includes a magnetic field.

* * * * *